(12) United States Patent
Posseme

(10) Patent No.: US 11,227,936 B2
(45) Date of Patent: Jan. 18, 2022

(54) METHOD OF MANUFACTURING A TRANSISTOR WITH A RAISED SOURCE AND DRAIN

(71) Applicant: COMMISSARIAT A L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/722,246

(22) Filed: Dec. 20, 2019

(65) Prior Publication Data

US 2020/0251569 A1 Aug. 6, 2020

(30) Foreign Application Priority Data

Dec. 20, 2018 (FR) ...................................... 18 73689

(51) Int. Cl.
*H01L 29/66* (2006.01)
*H01L 21/02* (2006.01)
(Continued)

(52) U.S. Cl.
CPC ...... *H01L 29/6653* (2013.01); *H01L 21/0217* (2013.01); *H01L 21/02126* (2013.01); *H01L 21/02164* (2013.01); *H01L 21/02167* (2013.01); *H01L 21/02532* (2013.01); *H01L 21/31111* (2013.01); *H01L 21/31155* (2013.01); *H01L 29/0847* (2013.01); *H01L 29/4983* (2013.01)

(58) Field of Classification Search
None
See application file for complete search history.

(56) References Cited

U.S. PATENT DOCUMENTS

| 6,153,483 | A | 11/2000 | Yeh et al. |
| 2017/0338157 | A1* | 11/2017 | Posseme ......... H01L 21/823468 |
| 2017/0358502 | A1 | 12/2017 | Grenouillet et al. |

FOREIGN PATENT DOCUMENTS

EP 3 246 948 A1 11/2017

OTHER PUBLICATIONS

French Preliminary Search Report dated Oct. 10, 2019 in French Application 18 73689 filed Dec. 20, 2018 (with English Translation of Categories of Cited Documents & Written Opinion), 8 pages.

* cited by examiner

*Primary Examiner* — Asok K Sarkar
(74) *Attorney, Agent, or Firm* — Oblon, McClelland, Maier & Neustadt, L.L.P.

(57) ABSTRACT

There is provided a method for producing a transistor with a raised source and drain the method including depositing a layer on the gate pattern and the active layer; carrying out an isotropic modification of the layer over a thickness to obtain a first portion of modified layer, carrying out an anisotropic modification of the layer over another thickness, along a direction normal to the active layer, to obtain second portions of modified layer, by conserving portions of non-modified layer on the flanks of the gate pattern and at the foot of the gate pattern, removing the first and second modified portions by conserving the portions, by selective etching, to form spacers having an L-shape, epitaxially growing the source and drain in contact with the L-shaped spacers, to obtain the source and drain having tilted faces.

18 Claims, 3 Drawing Sheets

(51) Int. Cl.
*H01L 21/311* (2006.01)
*H01L 21/3115* (2006.01)
*H01L 29/08* (2006.01)
*H01L 29/49* (2006.01)

METHOD OF MANUFACTURING A TRANSISTOR WITH A RAISED SOURCE AND DRAIN

TECHNICAL FIELD

The present invention relates to a method for producing spacers of a transistor. It relates more specifically to the production of L-shaped spacers. The present invention will have an advantageous application in producing a transistor comprising raised sources and drains and having tilted lateral faces.

STATE OF THE ART

The switching performance of a transistor can be improved by reducing the access resistance to source and drain regions of the transistor.

A solution for reducing this access resistance consists of raising the source and drain regions on either side of the gate of the transistor, generally by epitaxial recovery from the substrate. Such a transistor configuration comprising a gate and raised source and drain regions is called RSD (Raised Source/Drain).

The gate of the transistor is insulated regarding source and drain regions by spacers. The source and drain regions are here undifferentiated and referenced by one same acronym, "S/D".

The spacers cover the lateral flanks of the gate and bear on the substrate at the foot of the gate.

In an RSD configuration, the epitaxial recovery at the edge of the spacers can be impacted by the shape of these spacers. Spacers having substantially vertical flanks over the whole height of the gate favour the formation of raised S/D in the layer, bearing against the spacers. This configuration however generates an increase in the recovery capacity between the S/D and the gate, which damages the switching performance of the transistor.

Spacers having an L-shape leaned at the flanks of the gate favour the formation of faceted raised S/D, having free flanks separated from the spacers. The latter confirmation makes it possible to increase the separation distance between the faceted S/D and the gate. The recovery capacity is thus decreased. The performance of the RSD transistors are thus improved.

FIGS. 1A to 1E illustrate a known method for forming L-shaped spacers and, in fine, faceted S/D.

This known method comprises the following method steps:

A first layer 30 made of a first dielectric material is arranged in a conform manner on the gate 20 and on the semi-conductive active layer 11.

A second layer 40 made of a second material different from the first material is arranged in a conform manner on the first layer 30 (FIG. 1B).

An anisotropic etching of the first and second materials, selective regarding the material of the semi-conductive layer 11, is carried out so as to remove a sacrificial portion of the first and second layers 30, 40 facing the active layer 11, by conserving portions 31, 32, 41 of the first and second layers 30, 40 located on the flanks 24 of the gate 20 (FIG. 1C).

An isotropic etching of the second material, selective regarding the first material, is carried out so as to remove the portion 41 of the second layer 40 by conserving the portions 31, 32 of the first layer 30.

The portions 31, 32, of the first layer 30 thus form an L-shaped spacer on each of the flanks 24 of the gate 20 (FIG. 1D).

The S/D 60 formed by epitaxial recovery thus have faceted flanks 61 (FIG. 1E).

A disadvantage of this solution is that the anisotropic etching of the first and second materials induced a consumption of the active layer 11 by overetching. This consumption of the active layer 11 has the disadvantage of favouring the appearance of crystalline defects in the S/D during the epitaxial recovery.

Another disadvantage of this solution is that the different speeds of etching the first and second materials induce, on the scale of the wafer carrying the transistors, an inhomogeneity in the consumption of the active layer, in particular in the case of a great integration density of the transistors.

The present invention aims to partially overcome at least the disadvantages mentioned above.

An aim of the present invention is to propose a method for forming L-shaped spacers limiting the consumption of the active layer.

Another aim of the invention is to propose a method for producing a transistor comprising faceted raised S/D having an improved crystalline quality.

SUMMARY

To achieve this aim, the present invention provides a method for producing, on a semi-conductive active layer, at least one transistor comprising a gate, a source and a drain, said source and drain being raised with respect to the active layer and having lateral faces tilted with respect to a normal direction to the active layer, referenced direction Z, the method comprising at least the following steps:

Providing a stack comprising the active layer extending mainly along a main plane and a gate pattern, the gate pattern having lateral flanks extending perpendicularly to the active layer;

Depositing on the gate pattern and the active layer, a layer made of a dielectric material having a thickness $e_{30}$ and comprising portions, called lateral portions, covering the lateral flanks, and portions, called basal portions, extending mainly parallel to said main plane, the lateral portions being substantially normal to the basal portions;

Carrying out an isotropic modification of said layer over a thickness $e_{301}$, so as to obtain a first layer of modified portion comprising a modified dielectric material, with $e_{301} < e_{30}$, Before or after the step of producing an isotropic modification:

Carrying out an anisotropic modification of said layer over a thickness $e_{30}$, along the direction normal to the active layer, so as to obtain second portions of modified layer comprising the modified dielectric material by conserving portions of non-modified layer on the lateral flanks of the gate patter and on the active layer at the foot of the gate pattern, just under lateral portions covering the flanks of the gate pattern, Removing the first and second modified portions by conserving the portion of non-modified layer, by selective etching of the modified dielectric material opposite the non-modified dielectric material, so as to form spacers having an L-shape.

Optionally, then a step consisting of epitaxially growing the source and drain so as to obtain raised source and drain with respect to the active layer and having lateral faces tilted with respect to the direction Z. This epitaxy is carried out from the active layer and at the edge of said L-shaped spacers, preferably in contact with the latter.

Thus, the method according to the invention makes it possible to produce, on the flanks of the gate patter, L-shaped spacers from one single deposition of a layer made of a dielectric material.

The etching of the modified material also makes it possible, in one single step, to:
  form the L-shaped spacers, and
  expose the active layer in view of growing the source and drain by epitaxy.

The method according to the invention therefore requires less deposition and etching steps than a conventional method for forming L-shaped spacers such as presented above.

Furthermore, the etching of the modified material is advantageously isotropic.

This isotropic etching of the single modified material is easier to control than an anisotropic etching of a stack of two materials, such as implemented in the conventional method illustrated in FIGS. 1A to 1E.

In particular, such an isotropic etching can be specifically stopped at the level of the surface of the active layer, by limiting, even by removing the consumption of the latter.

The following step of growing faceted S/D by epitaxial recovery now benefits from an improved germination on the surface of the non-degraded or slightly degraded semiconductive active layer.

The crystalline quality of the faceted S/D is improved.

The isotropic and anisotropic modifications of the method according to the present invention can be advantageously carried out in no particular order.

These isotropic and anisotropic modifications can also be advantageously carried out within one same structure, for example in a plasma reactor or in a conventional implanter.

Other aims, features and advantages of the present invention will appear upon examining the following descriptions and supporting drawings. It is understood that other advantages can be incorporated.

BRIEF DESCRIPTION OF THE FIGURES

The aims, objectives, as well as the features and advantages of the invention will emerge better from the detailed description of an embodiment of the latter, which is illustrated by the following supporting drawings, wherein.

Figure 1A:
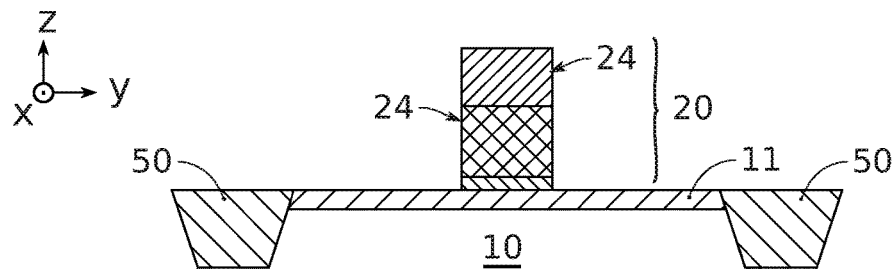
FIGS. 1A to 1E illustrate steps of a method for producing faceted S/D according to the prior art.
Figure 1B:
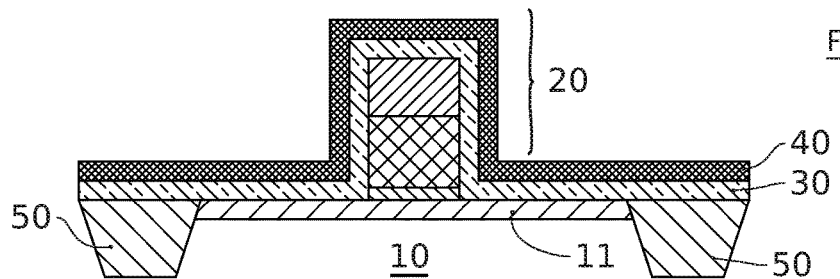
Figure 1C:
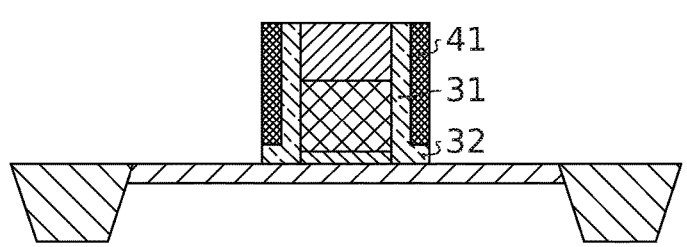
Figure 1D:
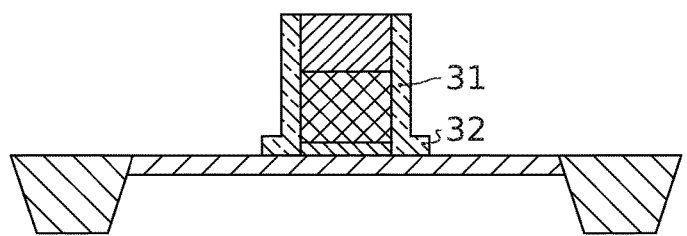
Figure 1E:
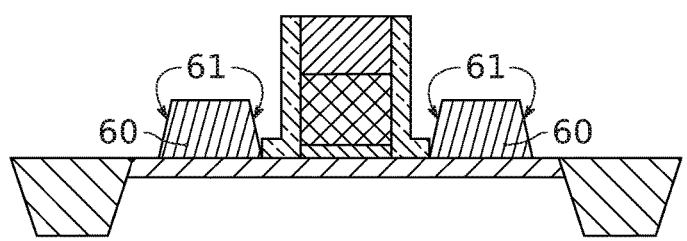

The drawings are given as examples and are not limiting of the invention. They constitute principle schematic representations intended to facilitate the understanding of the invention and are not necessarily to the scale of practical applications. In particular, the relative thicknesses of the different modified layers and portions are not representative of reality.

DETAILED DESCRIPTION

Before starting a detailed review of embodiments of the invention, optional features are stated below, which can possibly be used in association or alternatively:

According to an embodiment, the deposition of the layer made of a dielectric material is a conform deposition, such that the lateral and basal portions substantially have the same thickness $e_{30}$.

According to an embodiment, the isotropic modification is carried out before the anisotropic modification. Alternatively, the isotropic modification is carried out after the anisotropic modification.

According to an embodiment, the first portion of modified layer is conserved from the isotropic modification and the second portions of modified layer are conserved from the anisotropic modification. The isotropic modification is not an etching of the material of the layer made of a dielectric material. It is a step, separate and prior to the removal of the first modified portion. The anisotropic modification is not an etching of the material of the layer made of a dielectric material either. It is a step, separate and prior to the removal of the second modified portions.

According to an embodiment, the removal of the first and second modified portions is carried out after the isotropic and anisotropic modifications.

According to an embodiment, the layer made of a dielectric material is homogenous and only comprises said dielectric material. In particular, this layer does not comprise a plurality of layers having different chemical natures, before the isotropic and anisotropic modifications.

According to an embodiment, the dielectric material is selected from among SiN, SiCO, SiC, SiCN, SiOCN, SiCBN, SiOCH, and SiO2.

According to an embodiment, the thickness $e_{30}$ is of between 5 nm and 30 nm, preferably between 7 nm and 12 nm, and the thickness $e_{31}$ is of between 3 nm and 6 nm.

According to an embodiment, $e_{300}$ is the thickness of the dielectric layer which remains non-modified after the isotropic implantation step, with $e_{300}$ such that $e_{300}=e_{30}-e_{301}$ and $e_{300} \geq 2$ nm, preferably $e_{300} \geq 3$ nm and preferably $e_{300} \geq 5$ nm.

According to an embodiment, the thickness $e_{300}$ is such that $e_{300} \leq e_{30}-3$ nm.

According to an embodiment, the isotropic and anisotropic modifications are carried out by implantation of ions from an ion beam of at least one type from among argon (Ar), fluorine (F), oxygen (O) and hydrogen (H).

According to an embodiment, the isotropic modification is carried out by making a tilt angle of the ion beam vary during the implantation, said tilt angle being of between −30° and +30° with respect to the direction Z.

According to an embodiment, the anisotropic modification is carried out for an ion beam mainly directed along the direction Z during the implantation.

According to an embodiment, the isotropic and anisotropic modifications are carried out by implantation of ions implantation coming from a plasma, from at least one type from among $H_2$, He, HBr, and $NH_3$.

According to an embodiment, the isotropic modification is carried out by maintaining a pressure greater than 100 milli Torr during the implantation by plasma.

According to an embodiment, the anisotropic modification is carried out by maintaining a pressure less than 100 milli Torr during the implantation by plasma.

According to an embodiment, the selective etching of the modified dielectric material opposite the dielectric material is a wet etching using a hydrofluoric (HF) acid-based solution or using a phosphoric acid-based solution ($H_3PO_4$).

According to an embodiment, the selective etching of the modified dielectric material opposite the dielectric material is a dry etching, preferably carried out in a plasma formed from nitrogen trifluoride ($NF_3$) and ammoniac ($NH_3$), and wherein the dry etching comprises an etching step consisting of the formation of solid salts followed by a step of sublimating said solid types.

According to an embodiment, the selective etching of the modified dielectric material opposite the dielectric material comprises:
- a dry etching carried out by bringing together the first and second modified portions with a gaseous mixture, preferably only gaseous, comprising at least one first hydrofluoric (HF) acid-based component, the hydrofluoric acid transforming into non-volatile residue at ambient temperature, said first and second modified portions,
- after the dry etching, a removal of the non-volatile residue at ambient temperature by a wet cleaning or by a thermal sublimation annealing.

According to an embodiment, the isotropic modification is carried out by isotropic implantation of ions in the layer made of dielectric material using an implanter and by modifying a bombardment direction during the implantation or by isotropic implantation of ions coming from a plasma preferably comprising helium ions or hydrogen-based ions, at a pressure preferably greater than 100 milli Torr.

According to an embodiment, the anisotropic modification is carried out by anisotropic implantation of ions in the layer made of dielectric material using an implanter and by conserving a substantially constant bombardment direction during the implantation, this direction being substantially parallel to the lateral flanks of the gate pattern.

According to an embodiment, the anisotropic modification is carried out by anisotropic implantation of ions coming from a plasma, preferably comprising helium ions or hydrogen-based ions, at a pressure preferably less than 100 milli Torr.

According to an embodiment, the gate pattern is intended to form a gate for the transistor. The gate pattern is thus functional. It is thus a method that can be qualified as "gate first", i.e. wherein the gate is produced beforehand.

According to another embodiment, the gate pattern is intended to be removed, after having formed the spacers, to then be replaced by a functional gate pattern. The gate pattern is thus sacrificial. It is thus a method that can be qualified as "gate last", i.e. wherein the gate is produced second.

It is specified that, in the scope of the present invention, the terms "on", "surmounts", "covers", "underlying", "opposite" and the equivalents thereof do not necessarily mean "in contact with". Thus, for example, the deposition, the extension, the adhesion, the assembly or the application of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers made of one same material or of different materials.

By a material A-"based" substrate, film, layer, this means a substrate, a film, a layer comprising this material A only or this material A and possibly other materials, for example doping elements or alloy elements. Thus, a silicon-based layer extends, for example, from a Si, n-doped Si, p-doped Si, SiGe layer. A germanium-based layer extends, for example, from a Ge, n-doped Ge, p-doped Ge, SiGe layer.

The word "dielectric" qualifies a material, of which the electrical conductivity is sufficiently low in the given application to be used as an insulator. In the present invention, a dielectric material preferably has a dielectric constant less than 7.

The dielectric materials considered in the scope of the present invention are, in a non-limiting manner, SiN, SiCO, SiC, SiCN, SiOCN, SiCBN, SiOCH, $SiO_2$.

The modified dielectric material is considered different from the non-modified dielectric material.

The terms "dielectric material", "initial dielectric material", "non-modified dielectric material" are synonyms.

It is specified that, in the scope of the present invention, the thickness of a layer or of the substrate is measured along a direction perpendicular to the surface according to which this layer or this substrate has the maximum extension thereof.

In the present invention, the substrate and the active layer extending along a main plane. A direction perpendicular to this main plane is qualified as a direction normal to the substrate or to the active layer.

Figure 2A:
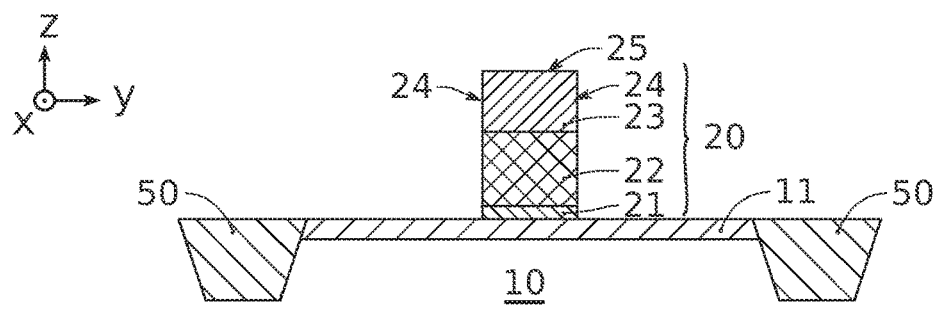
FIGS. 2A to 2E illustrate steps of an embodiment of the method for producing faceted S/D according to the invention.

In the figures, this plane corresponds to the plane XY of the orthogonal marker XYZ illustrated in FIG. 2A. The normal direction is parallel to the axis Z of this marker.

In the figures, the thickness is taken along the vertical in the zones which extend mainly to the horizontal, such as basal portions.

However, the thickness is taken along the horizontal in the zones which extend mainly to the vertical, such as the lateral portions. Thus, the thickness of the spacers which cover the vertical flanks of a gate or of a gate pattern will be measured along the horizontal direction in the figures.

Likewise, when it is indicated that an element is located just under or to the right of another element, this means that these two elements are both located over one same line perpendicular to the main plane, that is over one same line oriented vertically in the figures.

In the present invention, L-shaped spacers are formed. The L-shape corresponds to a shape having a longitudinal portion oriented along the vertical in the figures, and a foot substantially transverse to this longitudinal portion located at an end of this longitudinal portion. The L-shape also comprises the symmetrical shape thereof along the axis Z.

The foot of the L-shape can have a bevel, according to the embodiment of the invention implemented.

This L-shape is here specifically sought, for the advantages that they confer and which are reminded of in the introduction to the present invention.

The L-shape voluntarily produced in the present invention must be distinguished from an involuntary L-shape coming from an etching which is not very well controlled, for example. Such an involuntary L-shape could only be an incidental disclosure.

FIGS. 2A to 2E illustrate an embodiment of the method according to the invention.

According to this embodiment, an initial structure illustrated in FIG. 2A is provided.

This structure can typically comprise a substrate 10 surmounted by a silicon- or germanium-based semi-conductive active layer 11.

The substrate 10 can comprise a support surmounted by an electrically insulating layer, typically an oxide layer.

The support, the insulating layer and the active layer 11 can form a developed substrate of the semi-conductive on insulator type, for example a silicon on insulator (SOI) substrate or a germanium on insulator (GeOI) substrate.

Below in the description, the active layer 11, the substrate 10 and the developed substrate can equally be designated, "substrate".

The active layer 11 is surmounted by a gate 20 stack or gate 20 pattern.

Conventionally, the gate 20 stack can have successively the following layers arranged from the active layer 11: an interface oxide layer 21 with a high dielectric constant, called "high k" layer (for example, hafnium oxide-based), a polysilicon gate 22 and a hard mask 23.

The gate 20 stack typically has a height along Z of several tens of nanometres to several hundred nanometres.

Below in the description, and for brevity reasons, the gate stack or the gate pattern will be designated below as gate 20.

The invention also covers an alternative embodiment for which the gate 20 pattern is a sacrificial pattern intended to be removed after production of spacers, then to be replaced by another gate stack forming a gate 20. Such a method is commonly qualified as "gate last". The gate 20 below therefore equally designates a gate stack of "gate first" type (the gate is conserved from the production of the spacers) or of the "gate last" type (the gate is replaced from the production of spacers).

To form an insulated transistor opposite a transistor or an adjacent component, insulation boxes 50 commonly called STI (shallow trench isolation) can be formed.

The steps of forming L-shaped spacers on this initial structure, and consequently, the production of raised source and drain making it possible to obtain an RSD transistor form this initial structure, are described below in reference to a first embodiment.

Figure 2B:
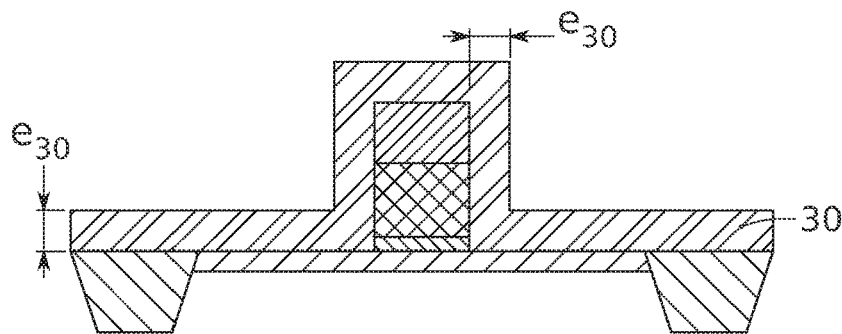

Such as illustrated in FIG. 2B, a layer 30 made of a dielectric material is deposited on the gate 20 and on the semi-conductive active layer 11, preferably in a conform manner.

This layer 30 comprises a lateral portion 30L on each of the lateral flanks 24 of the gate 20, basal portions 30B on the surface of the substrate on either side of the gate 20, in contact with the active layer 11, and a basal portion 30B at the top 25 of the gate 20. The lateral portions 30L extend along planes perpendicular to the plane XY and the basal portions 30B extend along planes parallel to the plane XY.

The layer 30 has a thickness $e_{30}$ of between 5 nm and 30 nm, preferably between 7 nm and 12 nm.

Figure 2C:
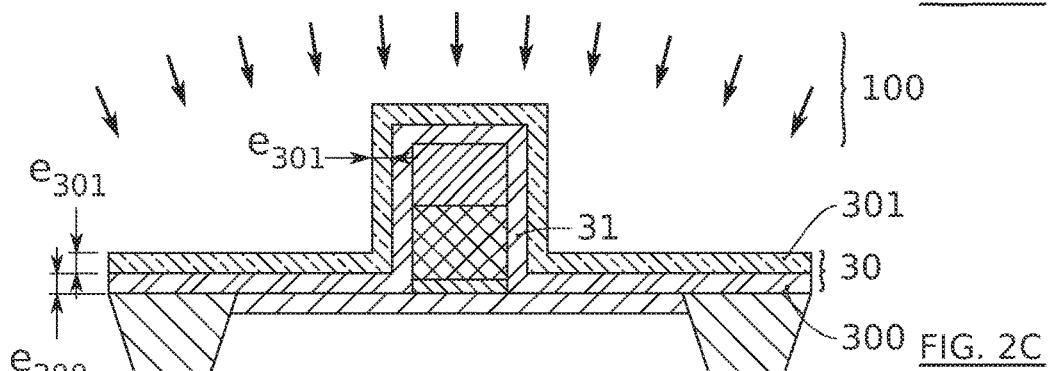

As illustrated in FIG. 2C, a first isotropic modification step is carried out.

The isotropic modification comprises, in particular, an implantation 100 of types, in particular of ions, in a first portion 301 of the superficial layer 30, so as to modify the initial dielectric material.

This isotropic modification forms a continuous portion 301 within the layer 30 and which extends from the surface of this layer 30. This portion 301 has a constant thickness $e_{301}$ along the layer 30, from the surface of the layer 30.

The portion 301 extends both along the main plane of the substrate and along the lateral flanks of the gate 20. The portion 301 comprises the modified dielectric material.

The isotropic modification is configured to obtain a thickness $e_{301}$ of modified dielectric material such that $e_{301}$ is strictly less than $e_{30}$.

The thickness $e_{301} \geq 2$ nm and preferably $e_{301} \geq 5$ nm. The thickness $e_{301}$ is such that $e_{301} \leq e_{30} - 3$ nm. Preferably, $e_{301}$ is of between 2 nm and 6 nm.

Different embodiments of the isotropic modification will be described in detail below.

From the isotropic modification step, a portion 300 of the initial layer 30 remains non-modified. This portion 300 has a thickness $e_{300} = e_{30} - e_{301}$.

Figure 2D:
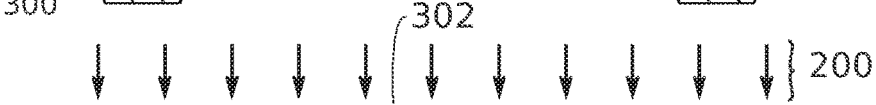
Figure 2D:
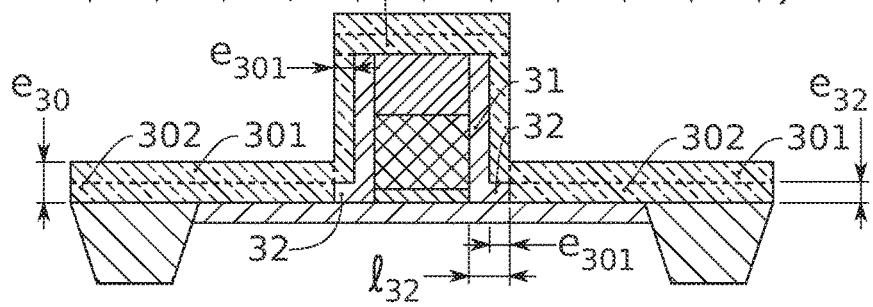

As illustrated in FIG. 2D, a second modification step, this time anisotropic, is carried out.

The anisotropic modification in particular comprises an implantation 200 of types, in particular of ions, in second portions 302 of the layer 30, so as to modify the initial dielectric material. This anisotropic implantation is carried out along a main bombardment direction of the ions. This main direction is parallel to the plane wherein the flanks 24 of the gate 20 mainly extend. In this example, this main direction is perpendicular to the plane XY of the substrate. This direction therefore corresponds to the axis Z.

This anisotropic modification forms within the layer 30 of the discontinuous portions 302 on all of the substrate. These portions 302 have a thickness $e_{30}$ at the level of the basal portions 30B of the layer 30.

The portions 302 only extend along the main plane of the substrate. The portions 302 comprise the modified dielectric material. The anisotropic modification is configured to modify the dielectric material on all of a thickness of the layer 30.

The portions 302 are partially superposed to the portion 301.

Different embodiments of the anisotropic modification will be described in detail below.

From these isotropic modification and anisotropic modification steps, portions 31, 32 of the initial layer 30 are conserved. These portions 31, 32 comprise the initial dielectric material, i.e. non-modified.

The portions 31 extend along the lateral flanks 24 of the gate 20. These portions 31 are arranged directly in contact with the gate. They extend over all of the height of the gate 20. They have the thickness $e_{300}$.

They advantageously form the longitudinal portion of the L.

The portions 32 extend along the active layer 11. They are preferably directly in contact with the active layer 11. They have a thickness $e_{32}$ along z, such that $e_{32} = e_{30} - e_{301}$. They have a dimension $l_{32}$ along y, substantially equal to $e_{30}$.

They advantageously form the foot of the L.

It will be noted that the distal end of the foot of the L is formed by a portion located just under modified portions 301 located on the flanks 24 of the gate 20. The dimension of this distal end of the foot of the L along the axis Y is equal to the thickness $e_{301}$. This dimension is directly conditioned by the thickness $e_{301}$.

Indeed, according to this embodiment comprising an isotropic modification carried out before the anisotropic modification, these are these modified portions 301 located on the flanks 24 of the gate 20 which mask the distal end of the foot of the L during the isotropic modification and prevent the modification thereof.

According to another embodiment comprising an anisotropic modification carried out before the isotropic modification, the distal end of the foot is masked by the lateral portion 30L during the anisotropic modification. It is then formed during the anisotropic modification over the thickness $e_{301}$.

It will be noted that during this anisotropic implantation, it can be that ions are implanted laterally in the dielectric layer 30 covering the flanks 24 of the gate 20 pattern. This lateral implantation, which therefore is not carried out along the favoured direction of the anisotropic implantation, and for example, due to a certain defection of the ions. This lateral implantation is carried out over a depth less than or equal to 2 nm, this depth being measured along the horizontal direction in FIG. 2D.

Advantageously, this involuntary lateral implantation does not negatively impact the dimensional control of the spacers 31 which will be formed. Indeed, this lateral implantation depth remains less than the modified depth $e_{301}$ during the isotropic implantation step. This technical effect is provided whatever the order, wherein the isotropic and anisotropic modification steps are carried out.

An etching of the portions 301, 302 is then carried out, so as to expose the portions 31, 32.

This etching is a selective etching of the modified dielectric material opposite the non-modified dielectric material, and opposite the substrate.

It is preferably isotropic.

Different etching solution adapted to this etching step will be detailed below.

Figure 2E:
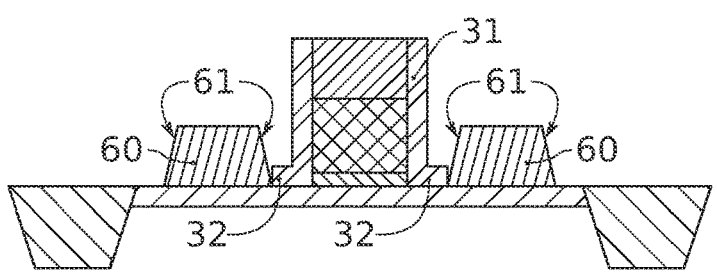

From this etching step, the L-shaped spacers are advantageously formed on each of the lateral flanks 24 of the gate 20 (FIG. 2E).

The S/D 60 are thus formed by epitaxial recovery at the edge of the L-shaped spacers. The S/D 60 thus formed advantageously have faceted flanks 61 (FIG. 2E).

In the embodiment described above in reference to FIGS. 2A to 2E, the isotropic modification is carried out before the anisotropic modification.

However, according to another embodiment covered by the claims, the isotropic modification is carried out after the anisotropic modification. It ensues, that the steps illustrated in FIGS. 2C and 2D are interchanged.

Figure 3:
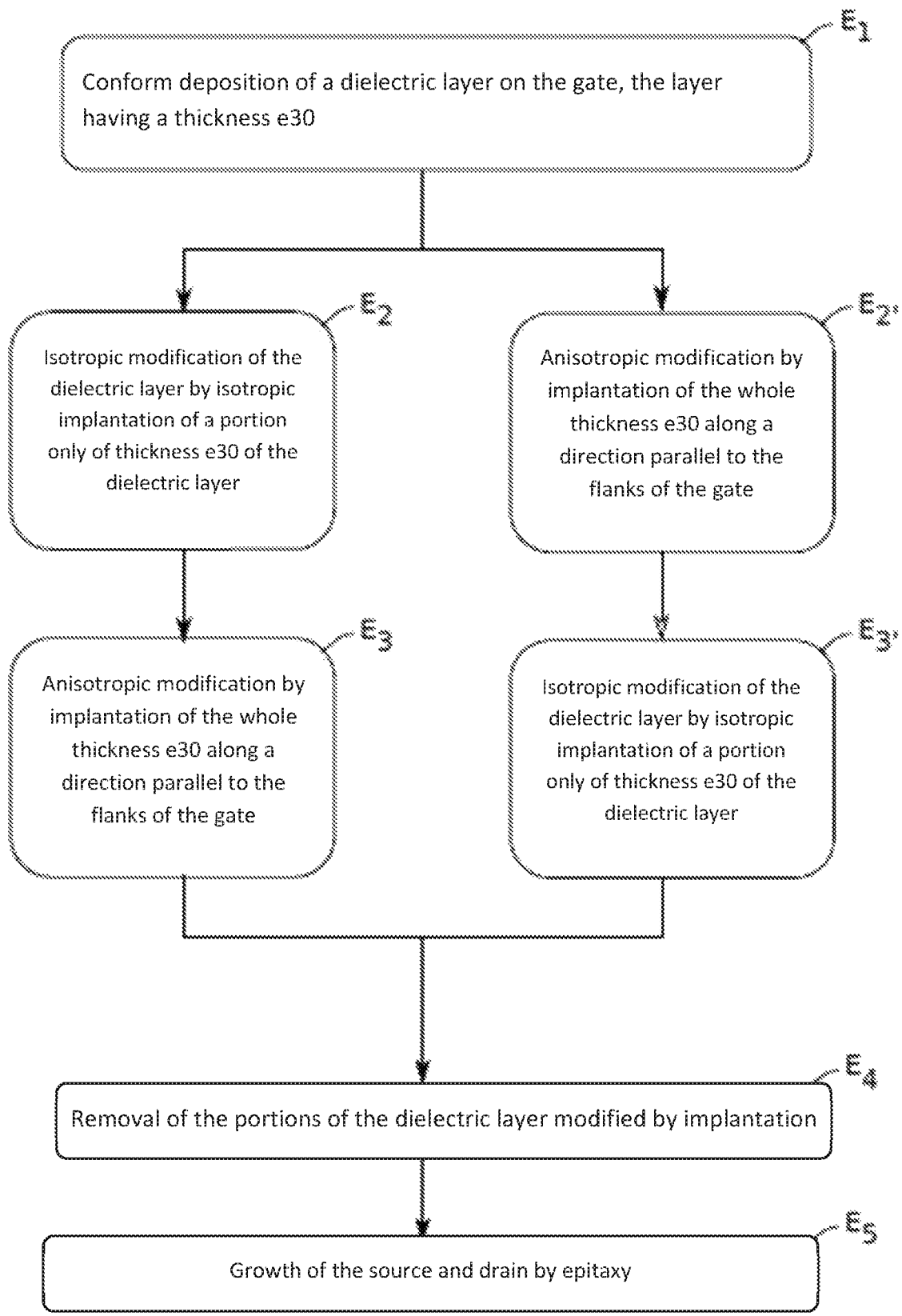
FIG. 3 illustrates, in a simplified manner in the form of a flowchart, the steps of two embodiments of the method for producing faceted S/D according to the invention.

FIG. 3 illustrates, in a simplified manner, in the form of a flowchart, the main steps of two embodiments of the method for producing faceted S/D according to the invention.

Step E1 relates to the conform deposition of the layer 30 of thickness $e_{30}$ on the gate 20.

Step E2 relates to the isotropic modification of the layer 30 by isotropic implantation 100 to form the modified portion 301 on the surface of the layer 30.

Step E3 relates to the anisotropic modification by anisotropic implantation 200 of all the thickness $e_{30}$ of the layer 30.

This FIG. 3 also makes the embodiment appear, wherein the anisotropic modification is carried out before the isotropic modification. This embodiment corresponds to steps E2' and E3'.

From these steps E2 then E3 or E2' then E3', the structure therefore has non-modified portions 31, 32 of the layer 30 and which form Ls on the flanks 24 of the gate 20.

The step E4 corresponds to the removal of modified portions 301, 302 selectively at the non-modified portions 31, 32 of the layer 30. From this step E4, the L-shaped spacers are produced.

Step E5 corresponds to the growth of the source 60 and drain by epitaxy, which, thanks to the foot of the L-shaped spacers, makes it possible to grow, in a tilted manner, the faces 61 of the source 60 and drain 60.

Different embodiments of the steps mentioned above will now be described in detail.

Isotropic Modification 100

As mentioned above in reference to FIG. 2C, the isotropic modification of a portion 301 of the dielectric layer 30 is carried out by an isotropic implantation 100 of ions.

This continuous portion 301 obtained is similar to a layer.

The implantation 100 thus makes it possible to define, in the dielectric layer 30:
  a modified layer 301, of which the thickness $e_{301}$ corresponds to the implantation depth of the dielectric layer 30,
  a non-modified layer 300, surmounted by the modified layer 301. The thickness $e_{300}$ of this non-modified layer corresponds to the initial thickness $e_{30}$ of the dielectric layer 30 less the thickness $e_{301}$ of the modified layer 301.
  Typically, $e_{301} \geq 2$ nm, and preferably, $e_{301} \geq 5$ nm. More generally, 2 nm $\leq e_{301} \leq$ 10 nm.
  For example, if 5 nm $< e_{30} <$ 30 nm, then 2 nm $< e_{301} <$ 10 nm.

According to a first example, the isotropic implantation 100 can be carried out in a conventional implanter (usually designated by "beamline", i.e. with an implantation by ion beam.

An advantage provided by the use of an implanter is the possibility to modify the lateral portions 30L of the dielectric layer 30 on the lateral flanks 24 of the gate 20 by bombarding along several implantation direction tilts.

For this type of implantation, the following types will, for example, be resorted to for modifying the dielectric layer 30: argon (Ar), fluorine (F), oxygen (O) or hydrogen (H). The tilt angle of the implantation will be adapted, as well as the energy from the ions according to the density and the shape of the patterns formed by the gate 20 stacks, as well as according to the thickness of the dielectric layer 30.

Typically, the dose implanted by ion beam is greater than $1^E 13$ atoms by squared centimetres (at/cm$^2$). It will be more generally of between $1^E 14$ and $1^E 17$ at/cm$^2$.

These implantation conditions are, for example, determined by simulation, by using SRIM (stopping and range of ions in matter) or TRIM (transport simulation of ions in matter) tools. These simulation tools can also be used to determine the implantation conditions for the implantations by plasma which will be detailed below.

According to a second example, favoured, the isotropic implantation 100 can be carried out in an item of plasma etching equipment. In this case, a capacitive coupling plasma (CCP) reactor or an inductive coupling plasma (ICP) reactor, or a plasma by immersion can be carried out.

The implantation of ions by plasma is an advantageous solution, in particular since it makes it possible to accurately control the implanted depth, in order to:
  implant and therefore modify only some of the thickness of the dielectric layer 30;
  not implant the underlying layers, in particular, the active layer 11 and the different layers of the gate 20 stack.

Moreover, the interest of the plasma is that a chemical modification can be had, in particular by H implantation, which makes the removal of the modified layer easier.

According to an embodiment example, this modification comprises the implantation of hydrogen-based ions (H, H$^+$, H$_2^+$, H$_3^+$, etc.).

According to another embodiment, the implanted ions are helium (He) ions, or a mixture of helium and hydrogen (H/He) ions.

These ions can originate, for example, from the following gases introduced in the reactor: H$_2$, HBr; NH$_3$.

In order to obtain an isotropic modification 100 by implantation by plasma, several parameters can be played on:

Pressure. Preferably, it is greater than 100 milli Torr. This makes it possible to have a deflection of ions to reach the lateral flanks 24 of the gate 20 stacks.

Temperature. It is preferably less than 100° C. which makes it possible to modify more effectively the dielectric layer 30. It has been observed that beyond 100° C., the H implanted ions desorb, which lessens the desired modification effect.

The implanted types. The H and He-based ions make it possible for an implantation of the dielectric layer 30 without spraying the latter and without deposition on the surface of the latter.

The bias voltage and/or the source can also be pulsed so as to heighten the isotropic effect.

In addition to the advantages mentioned above, the implantation by plasma has the advantage of making it possible for a continuous implantation in a volume extending from the surface of the implanted layer.

Furthermore, the use of a plasma makes it possible for an implantation at depths, shallower than the minimum depths that can be obtained with implanters. Thus, an implantation by plasma makes it possible to effectively and relatively homogenously, or at the very least, continuously implant very thin thicknesses, typically of a few nanometres. This implantation continuity from the implanted face makes it possible to improve the homogeneity of the modification according to the depth, which leads to a constant etching speed over time of the implanted layer. Moreover, the increase of the selectivity conferred by the implantation opposite other layers is effective from the start of the etching of the implanted layer. The implantation by plasma thus makes it possible for a significantly improved control of the etching.

From this isotropic implantation step 100, a portion 301 only of the dielectric layer 30 is modified.

The modified layer 301 has a constant thickness $e_{301}$ over all of the surface thereof, the thickness of this layer 301 being measured, at each point of this layer 301, along a direction perpendicular to the tangent at this point.

Anisotropic Modification 200

As mentioned above in reference to FIG. 2D, the following or preceding isotropic modification step 100, consists of anisotropically modifying the layer 30, over the whole thickness $e_{30}$ and along a direction parallel to the lateral flanks 24 of the gate 20 stack.

This anisotropic modification 200 thus makes it possible to modify the basal portions 30B of the layer 30 over the whole thickness $e_{30}$.

However, this modification does not modify the portions 31, 32 located on the flanks 24 and at the foot of the gate 20 stack, these portions being masked by the basal portion 30B located at the top 25 of the gate 20 stack.

This anisotropic modification 200 is carried out by anisotropic implantation of ions over the whole thickness $e_{30}$ stopping at the interface between the dielectric layer 30 and the layers 11, 50 which are themselves underlying.

Like for the isotropic modification 100, this anisotropic modification 200 can be carried out in an implanter or from a plasma. These two embodiments and the variants thereof are detailed below:

According to a first example, the anisotropic implantation can be carried out in a conventional implanter.

Contrary to the isotropic implantation, the implantation angle remains constant all along the implantation. This tilt is parallel to the flanks 24 of the gate 20 covered by the dielectric layer 30.

The implanted types can be argon (Ar), fluorine (F), oxygen (O) or hydrogen (H). These types make it possible for an accurate implantation in order to stop the implantation at the interfaces between the dielectric layer 30 and the layers 11, 50 which are themselves underlying on the one hand, and between the dielectric layer 30 and the gate 20 stack (interface 25) on the other hand.

In the following step, the modified portions 301, 302 of the dielectric layer 30 can thus be removed by dry etching and selectively opposite the active layer 11 and the gate 20 stack.

According to a second favoured example, the anisotropic implantation 200 can be carried out in an item of plasma etching equipment. In this case, a capacitive coupling plasma (CCP) reactor of an inductive coupling plasma (ICP) reactor, or a plasma by immersion can be used.

The implantation of ions by plasma is an advantageous solution, in particular since it makes it possible to accurately control the implanted depth, in order to:

implant and therefore modify the whole thickness of the dielectric layer 30;

not implant the underlying layers, in particular the active layer 11 and the different layers of the gate 20 stack.

The other advantages mentioned in the case of the isotropic implantation 100 by plasma are also valid for the anisotropic implantation 200 by plasma.

The following parameters will be adjusted, in order to obtain an anisotropic implantation 200 by implantation by plasma, over a specific depth corresponding to the whole thickness of the dielectric layer 30.

These parameters are, in particular:

the pressure inside the chamber of the plasma reactor. Preferably, this pressure is less than 100 milli Tor, this in order to avoid an isotropic implantation;

the temperature will preferably be less than 100° C., in order to effectively modify the dielectric layer 30.

For all these embodiments, the implantation conditions can be determined by simulation using an SRIM or TRIM tool.

In addition to the advantages mentioned above, the implantation by plasma makes it possible to use the same plasma reactor for the isotropic modification 100 and for the anisotropic modification 200.

Preferably, the isotropic modification will be carried out with the same equipment as the anisotropic modification, in order to simplify the method and to reduce the costs.

Also, according to another embodiment, during the isotropic modification step or during the anisotropic modification step, and preferably during each of these modification steps, the plasma used is formed from a gas comprising at least one first non-carbon gaseous component, of which the separation generates said light ions and a second gaseous component comprising at least one type favouring the separation of the first component to form said light ions, wherein the gas ratio between the first component and the second component is between 1:19 and 19:1.

Preferably, said ratio is between 1:9 and 9:1 and preferably between 1:5 and 5:1.

Preferably:

The first component is selected from among hydrogen ($H_2$), silicon nitride ($SiH_4$), hydrogen nitride ($NH_3$) or hydrogen bromide (HBr).

The second component is selected from among helium (He), nitrogen ($N_2$), argon (Ar) or xenon (Xe).

Preferably, the flow of the first component is between 10 and 1000 sccm (cubic centimetres per minute) and the flow of the second component is preferably between 10 and 1000 sccm.

Advantageously, the role of the first component is to modify, by ionic bombardment, the crystalline structure of the dielectric layer, in order to be able to, subsequently, distinguish the initial dielectric layer from the modified dielectric layer. The problem is that if a plasma based on only one single component is used, hydrogen ($H_2$), for example, the risk is not evenly modifying the dielectric layer in the thickness thereof. This leads to an incorrect controlling of the real depth until which the modified layer has a significantly improved selectivity. In this case, the depth of the ionic implantation in the dielectric layer is not equal to the thickness of the modified dielectric layer, of which the selectivity is significantly improved and which will be etched following the bombardment.

The addition of a second component acting advantageously as a separation gas (such as argon, helium, xenon, nitrogen), makes it possible to facilitate the separation of the first component, and by this means, to favour the implantation of said first separated component in the dielectric layer, in the form light ions. The implanted dose and therefore increased dose, without needing to increase the maximum implantation depth.

It is therefore important to find an appropriate ratio between the content of first component and of second component in the plasma intended to modify the dielectric layer. Advantageously, the gas ratio between the first component and the second component is greater than 1:19 and less than 19:1.

These implantations 100, 200 of ions are carried out, preferably solid wafer. They make it possible to modify the dielectric layer 30 without spraying it. Thus, it is mainly a chemical modification, the addition of ions in this layer 30 changing the selectivity at the etching of this layer 30. Thus, the modified portions 301, 302 of this layer 30 will be etched a lot more easily than the non-modified portions 31, 32, the underlying layers 11, 50, as well as the gate 20 stack.

Selective Removal of the Modified Portions 301, 302

For each of the embodiments mentioned above and based on an implantation of ions, several embodiment variants for the selective removal of modified portions 301, 302 of the dielectric layer 30 are possible.

Dry or wet etching chemistries mentioned can be used.

According to an embodiment, the step of removing modified portions 301, 302 is carried out by selective wet etching with the semi-conductive material of the active layer 11. If the semi-conductive material is silicon, then the step of removing modified portions 301, 302 is carried out by wet etching, selectively with silicon (Si) and/or with silicon oxide ($SiO_2$) of the isolation trenches 50.

Preferably, the selective etching with silicon is obtained using a hydrofluoric (HF) acid-based solution or using a phosphoric acid-based solution ($H_3PO_4$).

As an example for a dielectric layer 30 made of SiN, with a hydrofluoric (HF) acid-based solution, the etching speed ratio between modified SiN and SiN is of around 30; as an example, the etching speed ratio between modified SiN and $SiO_2$ is of around 38.

This makes it possible to fully remove the modified portions 301, 302 without consuming the non-modified portions 31, 32 on the flanks 24 and at the foot of the gate 20; the active layer 11; the trenches 50.

The performance of the transistors is thus preserved.

The semi-conductive material can also be germanium (Ge) or silicon-germanium (SiGe).

According to an embodiment, particularly advantageous when the dielectric layer 30 is made of a material taken from among: a silicon nitride, SiC, SiCN, SiCBN, the selective etching of the modified portions 301, 302 opposite non-modified portions comprises a wet etching with a basis of a solution comprising hydrofluoric (HF) acid diluted to x % by mass, with x≤0.2 and having a pH less than or equal to 1.5.

Preferably, the pH is less than or equal to 1.3, preferably less than or equal to 1 and preferably strictly less than 1.

Preferably, x≤0.15 and preferably x≤0.1. According to an example, x is substantially equal to 0.1.

Preferably, the solution is obtained by adding at least one from among: hydrochloric (HCl) acid, sulphuric acid $H_2SO_4$, nitric acid $HNO_3$.

Particularly surprisingly, this etching makes it possible to increase very significantly the selectivity of the etching of the modified dielectric layer opposite silicon oxide-based materials, designated generally $SiO_y$, in the present patent application, with y an integer greater than or equal to 1.

This improved selectivity is very advantageous, since often, a hard mask on the top 25 of the gate 20 or an isolation trench 50, with an $SiO_y$ base, are present during the etching step.

It ensues, that the hard mask 25 or the isolation trenches 50 are not altered by the etching of the spacers. They can therefore fully play the roles thereof.

Usually, pHs which are as acid are not used, as they have no interest in the scope of conventional etching of $SiO_y$, such as $SiO_2$.

For example, with the method according to the invention, a selectivity of the etching is obtained with respect to silicon dioxide such as for a thickness e1 of etched modified nitride, over the same time, only one thickness e1/33.7 of silicon dioxide is etched.

According to another embodiment, the removal step is carried out by selective dry etching with the semi-conductive material. Preferably, the step of removing modified portions 301, 302, typically made of silicon nitride, is carried out by selective dry etching with silicon (Si) and/or with silicon oxide ($SiO_2$). According to an embodiment, the dry etching is carried out in a plasma formed in a confined chamber from nitrogen trifluoride ($NF_3$) and ammoniac ($NH_3$).

Advantageously, the dry etching comprises: an etching step consisting of the formation of solid salts; a step of sublimating solid types. This embodiment makes it possible to obtain a very good selectivity of the etching of the modified nitride with respect to the non-modified nitride and with the semi-conductive material. In particular, this selectivity of the etching is a lot greater (typically, a factor of 10 at least) to that obtained with an HF solution.

According to another embodiment, the step of removing modified portions 301, 302 opposite non-modified portions 31, 32 comprises a dry etching carried out by bringing together a gaseous mixture, preferably only gaseous, comprising at least one first hydrofluoric (HF) acid-based component. The hydrofluoric acid transforms into non-volatile residue, preferably non-volatile at ambient temperature, the modified portions 301, 302 of the dielectric layer 30.

Advantageously, the step of removing portions 301, 302 comprises, only after the dry etching, a removal of the non-volatile residue at ambient temperature by a wet cleaning or a thermal sublimation annealing.

Advantageously, the dry etching consumes modified portions 301, 302 of the dielectric layer 30, preferably at the non-modified portions 31, 32 and at the active layer 11. Thus, the risk of excessive consumption of semi-conductive material on the surface of the active layer 11 is reduced, even removed.

The epitaxial recovery intended to form the S/D 60 thus benefits from a non-degraded germination surface.

The epitaxial recovery is optimised. The faceted S/D 60 have an improved crystalline quality.

The invention is not limited to the embodiments described above and extends to all the embodiments covered by the claims.

The invention claimed is:

1. A method for producing, on a semi-conductive active layer, at least one transistor comprising a gate, a source, and a drain, the source and the drain being raised with respect to the active layer and having lateral faces tilted with respect to a direction normal to the active layer, referenced direction Z, the method comprising:
   providing a stack comprising the active layer extending mainly along a main plane and a gate pattern, the gate pattern having lateral flanks extending perpendicularly to the active layer;
   depositing, on the gate pattern and the active layer, a layer made of a dielectric material having a thickness $e_{30}$ and comprising lateral portions covering the lateral flanks, and basal portions extending mainly parallel to the main plane, the lateral portions being substantially normal to the basal portions; and
   carrying out an isotropic modification of the layer made of the dielectric material over a thickness $e_{301}$ by implantation of ions directly into said layer not being covered or partially covered by another layer between said layer and the ions, so as to obtain a first portion of modified layer comprising a modified dielectric material, with $0 < e_{301} < e_{30}$,
   wherein, before or after the step of carrying out an isotropic modification:
   carrying out an anisotropic modification of the layer made of the dielectric material over a thickness $e_{30}$ by implantation of ions along the direction normal to the active layer, so as to obtain second portions of modified layer comprising the modified dielectric material by conserving portions of non-modified layer on the lateral flanks of the gate pattern and on the active layer at the foot of the gate pattern, just under the lateral portions covering the flanks of the gate pattern,
   removing the first and the second portions of modified layer, called modified portions, by conserving the portions of non-modified layer, by selective etching of the modified dielectric material opposite a non-modified dielectric material, so as to form spacers having an L-shape, and
   epitaxially growing the source and the drain in contact with the L-shaped spacers, so as to obtain the raised source and drain with respect to the active layer and having lateral faces tilted with respect to the direction Z.

2. The method according to claim 1, wherein the first portion of modified layer is conserved from the isotropic modification and the second portions of modified layer are conserved from the anisotropic modification.

3. The method according to claim 1, wherein the removal of the first and second modified portions is carried out after the isotropic and anisotropic modifications.

4. The method according to claim 1, wherein the layer made of the dielectric material is homogenous and only comprises the dielectric material.

5. The method according to claim 1, wherein the deposition of the layer made of the dielectric material is a conformal deposition, such that the lateral and the basal portions have substantially a same thickness $e_{30}$.

6. The method according to claim 1, wherein the isotropic modification is carried out before the anisotropic modification.

7. The method according to claim 1, wherein the isotropic modification is carried out after the anisotropic modification.

8. The method according to claim 1,
   wherein a thickness $e_{300}$ is a thickness of the layer that remains non-modified by the isotropic modification, with $e_{300} = e_{30} - e_{301}$, and
   wherein $e_{300}$ is such that $e_{300} \geq 2$ nm.

9. The method according to claim 8, wherein the thickness $e_{300}$ is such that $e_{300} \leq e_{30} - 3$ nm.

10. The method according to claim 1, wherein the thickness $e_{30}$ is between 5 nm and 30 nm, and the thickness $e_{301}$ is between 3 nm and 6 nm.

11. The method according to claim 1, wherein the dielectric material is selected from among SiN, SiCO, SiC, SiCN, SiOCN, SiCBN, SiOCH, and $SiO_2$.

12. The method according to claim 1, wherein the isotropic and the anisotropic modifications are carried out by implantation of ions from an ion beam of at least one type from among argon, fluorine, oxygen, and hydrogen.

13. The method according claim 12, wherein the isotropic modification is carried out by making a tilt angle of the ion beam vary during the implantation, the tilt angle being between −30° and +30° with respect to the direction normal to the substrate.

14. The method according to claim 12, wherein the anisotropic modification is carried out for the ion beam mainly directed along the direction normal to the substrate during the implantation.

15. The method according to claim 1, wherein the isotropic and the anisotropic modifications are carried out by the implantation of ions coming from a plasma, from at least one type from among $H_2$, He, HBr, and $NH_3$.

16. The method according to claim 15, wherein the isotropic modification is carried out by maintaining a pressure greater than 100 milli Torr during the implantation.

17. The method according to claim 15, wherein the anisotropic modification is carried out by maintaining a pressure less than 100 milli Torr during the implantation.

18. The method according to claim 1, wherein the selective etching of the modified dielectric material opposite the dielectric material is a wet etching using a hydrofluoric acid-based solution or using a phosphoric acid-based solution.

* * * * *